United States Patent
Tanaka et al.

(10) Patent No.: US 9,653,350 B2
(45) Date of Patent: May 16, 2017

(54) PRE-TREATMENT METHOD FOR PLATING AND STORAGE MEDIUM

(71) Applicant: Tokyo Electron Limited, Tokyo (JP)

(72) Inventors: Takashi Tanaka, Nirasaki (JP); Nobutaka Mizutani, Nirasaki (JP); Yusuke Saito, Nirasaki (JP); Mitsuaki Iwashita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/548,794

(22) Filed: Nov. 20, 2014

(65) Prior Publication Data

US 2015/0140816 A1    May 21, 2015

(30) Foreign Application Priority Data

Nov. 21, 2013  (JP) ................................. 2013-241080

(51) Int. Cl.
*B05D 3/00*   (2006.01)
*H01L 21/768*   (2006.01)
(Continued)

(52) U.S. Cl.
CPC .... *H01L 21/76874* (2013.01); *C23C 18/1893* (2013.01); *H01L 21/76898* (2013.01);
(Continued)

(58) Field of Classification Search
CPC .......... B05D 3/002; B05D 3/10; B05D 3/105; B05D 3/02; H01L 21/76874; C23C 18/1893
(Continued)

(56) References Cited

U.S. PATENT DOCUMENTS 6,117,366 A * 9/2000 Park .......................... H01B 1/22
                                                      252/512
6,555,158 B1 * 4/2003 Yoshio ................ C23C 18/1607
                                                      257/E21.174
(Continued)

FOREIGN PATENT DOCUMENTS

JP    06-186417 A    7/1994
JP    2000-264761 A    9/2000
(Continued)

*Primary Examiner* — Kirsten Jolley
(74) *Attorney, Agent, or Firm* — Pearne & Gordon LLP

(57) ABSTRACT

Catalytic metal nanoparticles can be attached on a base. A pre-treatment method for plating includes a catalytic particle-containing film forming process of forming a catalytic particle-containing film on a surface of a substrate by supplying, onto the substrate, a catalytic particle solution which is prepared by dispersing the catalytic metal nanoparticles and a dispersing agent in a solvent containing water; a first heating process of removing moisture contained at least in the catalytic particle-containing film by heating the substrate to a first temperature; and a second heating process of polymerizing the dispersing agent to have a sheet shape by heating the substrate to a second temperature higher than the first temperature after the first heating process and fixing the catalytic metal nanoparticles on a base layer by covering the catalytic metal nanoparticles with the sheet-shaped dispersing agent.

6 Claims, 4 Drawing Sheets

(51) Int. Cl.
    *C23C 18/18*    (2006.01)
    *B05D 3/02*    (2006.01)
    *B05D 3/10*    (2006.01)
    *C23C 18/40*    (2006.01)
    *C23C 18/48*    (2006.01)

(52) U.S. Cl.
    CPC ............... *B05D 3/002* (2013.01); *B05D 3/02* (2013.01); *B05D 3/10* (2013.01); *C23C 18/40* (2013.01); *C23C 18/48* (2013.01)

(58) Field of Classification Search
    USPC ........................................ 427/258, 299, 380
    See application file for complete search history.

(56) References Cited

U.S. PATENT DOCUMENTS

| | | | |
|---|---|---|---|
| 8,283,577 B2 * | 10/2012 | Naito ................... | B41M 3/006 |
| | | | 156/245 |
| 2009/0133923 A1 * | 5/2009 | Kotsubo ................. | G02B 1/10 |
| | | | 174/389 |
| 2009/0197045 A1 * | 8/2009 | Okada ....................... | C22C 5/06 |
| | | | 428/141 |
| 2009/0321689 A1 * | 12/2009 | Harada ............... | B01F 17/0007 |
| | | | 252/513 |

FOREIGN PATENT DOCUMENTS

| | | |
|---|---|---|
| JP | 2011-195896 A | 10/2011 |
| JP | 2012-216722 A | 11/2012 |
| JP | 2013-067856 A | 4/2013 |

* cited by examiner

PRE-TREATMENT METHOD FOR PLATING AND STORAGE MEDIUM

CROSS-REFERENCE TO RELATED APPLICATION

This application claims the benefit of Japanese Patent Application No. 2013-241080 filed on Nov. 21, 2013, the entire disclosures of which are incorporated herein by reference.

TECHNICAL FIELD

The embodiments described herein pertain generally to a method of performing a pre-treatment as a surface treatment before filling a recess formed in a substrate by plating.

BACKGROUND

Recently, semiconductor devices such as a LSI or the like have been required to have higher density in order to meet requirements for reducing the mounting space or for improving the processing rate. As an example of a technology that achieves the high density, there has been known a multilayer wiring technology of manufacturing a multilayer substrate, such as a three-dimensional LSI or the like, by stacking multiple wiring substrates.

According to the multilayer wiring technology, a TSV (Through Silicon Via), which penetrates the wiring substrates and in which a conductive material such as copper (Cu) is buried, is typically formed in the wiring substrate in order to obtain electrical connection between the wiring substrates. As an example of a technology for forming the TSV in which a conductive material is buried, there has been known an electroless plating method.

In case of forming a metal film by electroless plating, it is required to improve adhesivity between a base and the metal layer. For the purpose, conventionally, a self-assembled monolayer (SAM) is formed on the base by using a coupling agent such as a silane coupling agent or a titanium coupling agent, and a catalytic metal such as palladium particles is provided on the base with the self-assembled monolayer therebetween. For example, as described in Patent Document 1, by supplying a catalytic particle solution containing palladium nanoparticles coated with a dispersing agent such as PVP (PolyvinylPyrrolidone), the catalytic metal can be adsorbed onto the self-assembled monolayer.

However, adhesiveness of the palladium nanoparticles is not sufficiently high, so that the palladium nanoparticles may be separated from the base during a cleaning process which is performed prior to a subsequent barrier layer forming process of forming a barrier layer by electroless plating. As a result, a sound barrier layer may not be formed. If the soundness of the barrier layer is low, the soundness of layers formed on the barrier layer, such as a seed layer and a copper plating layer forming a wiring, may also be weakened.

Patent Document 1: Japanese Patent Laid-open Publication No. 2013-067856.

SUMMARY

In view of the foregoing, example embodiments provide a pre-treatment method for plating, capable of allowing catalytic metal nanoparticles to be securely attached on a base while enabling to form a uniform plating layer having sufficient adhesivity.

In one example embodiment, a pre-treatment method for plating includes a catalytic particle-containing film forming process of forming a catalytic particle-containing film on a surface of a substrate by supplying, onto the substrate, a catalytic particle solution which is prepared by dispersing catalytic metal nanoparticles and a dispersing agent in a solvent containing water; a first heating process of removing moisture contained at least in the catalytic particle-containing film by heating the substrate to a first temperature; and a second heating process of polymerizing the dispersing agent to have a sheet shape by heating the substrate to a second temperature higher than the first temperature after the first heating process and fixing the catalytic metal nanoparticles on a base layer by covering the catalytic metal nanoparticles with the sheet-shaped dispersing agent.

According to the example embodiments, by removing moisture from the catalytic particle-containing film through the first heating process and then performing the second heating process at the temperature higher than the temperature of the first heating process, polymerization is accelerated, and a high-quality layer of the sheet-shaped dispersing agent is formed. This layer allows the catalytic metal nanoparticles to be firmly attached to the base. Therefore, it is possible to improve the quality of a plating film formed by the plating process performed with the metal nanoparticles as a catalyst.

In another example embodiment, a computer-readable storage medium has stored thereon computer-executable instructions that, in response to execution, cause a plating system to perform the pre-treatment method for plating The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1A:
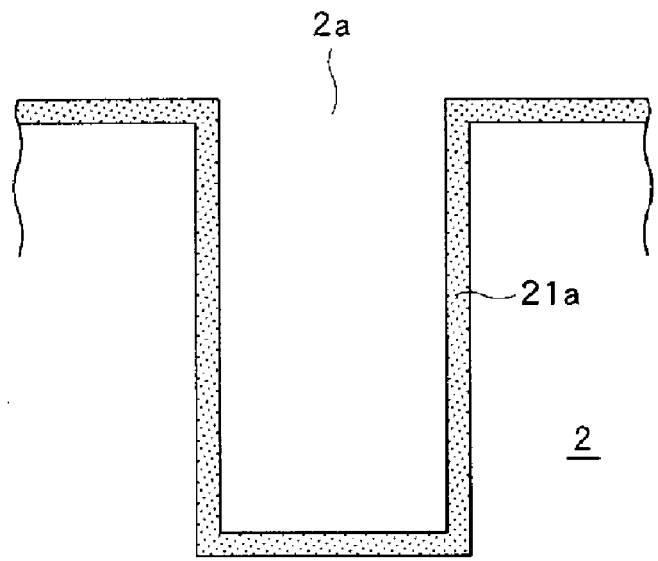
FIG. 1A and FIG. 1B are cross sectional views of a substrate in the vicinity of a recess in order to explain a silane coupling process and a titanium coupling process.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a series of processes of burying Cu (copper) in a recess (a recess to be formed as a TSV (Through Silicon Via)) formed on a substrate will be described in detail with reference to the accompanying drawings. These series of processes include respective processes of a pre-treatment method for plating in accordance with an example embodiment.

A substrate (silicon substrate) 2 having a previously formed recess (hole) 2a to be formed as a TSV is prepared. The recess 2a may be formed by a commonly known dry etching process using, for example, photolithography. As one example, the recess 2a may be formed by ICP-RIE (Inductively Coupled Plasma Reactive Ion Etching).

Below, the pre-treatment for plating will be discussed.

(Hydrophilic Process)

First, a hydrophilic process is performed on the substrate 2. The hydrophilic process may be implemented by any of various commonly known methods such as a UV (Ultraviolet) irradiation process, a plasma oxidation process, a SPM process (Piranah cleaning), and so forth. Through this hydrophilic process, a surface of the substrate is turned into a state where a coupling agent to be described later can be easily coupled to the surface of the substrate. In case that the hydrophilic process is implemented by the SPM process, a rinse process by DIW (pure water) is performed after the SPM process.

(Silane Coupling Process)

Subsequently, a silane coupling process, in which a silane-based coupling layer 21a (see FIG. 1A) is formed on the surface of the substrate including an inner surface of the recess 2a by adsorbing a silane coupling agent, is performed. Here, the term "silane-based coupling layer" implies a layer composed of a self-assembled monolayer formed from a silane coupling agent. This silane-based coupling layer is provided between a base (here, silicon) and an upper layer (a catalytic particle-containing layer 22 to be described later), and enhances the coupling therebetween.

Figure 3A:
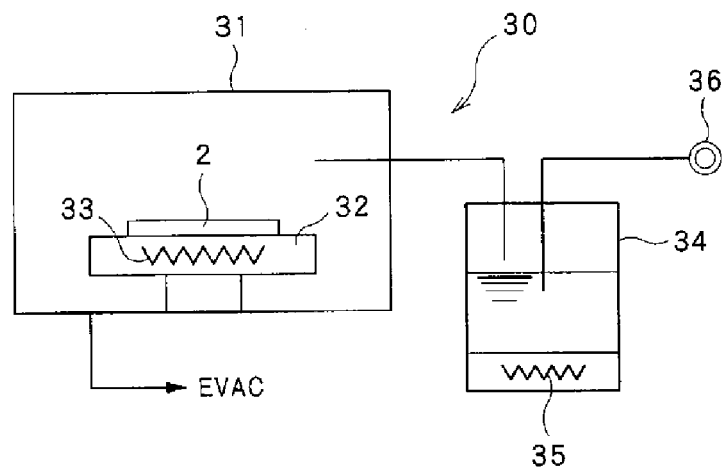
FIG. 3A to FIG. 3C are diagrams schematically illustrating configurations of apparatuses used in a pre-treatment for plating.

In the present example embodiment, the silane coupling process is implemented by a vacuum deposition process. The vacuum deposition process may be performed by using a vacuum deposition apparatus 30 having a configuration schematically illustrated in FIG. 3A, for example. In this apparatus, the substrate 2 is mounted on a mounting table 32 provided within a processing chamber 31 in a vacuum (decompressed) atmosphere, and the substrate 2 is heated to, e.g., about 100° C. by a heater 33 embedded in the mounting table 32. In this state, a silane coupling agent stored in a liquid state within a tank 34 is heated and vaporized by a heater 35 to be supplied into the processing chamber 31 by being carried with a carrier gas supplied from a carrier gas supply source 36.

Alternatively, the silane coupling process may be implemented by a liquid process. As the liquid process, a spin-on process using a spinner (a spin-type liquid processing apparatus) to be used in a titanium coupling process to be described later, an immersion process of immersing a substrate in a bath filled with a silane-coupling agent, or the like may be used. Further, in case of performing the silane coupling process through such a liquid process, a bake process needs to be additionally performed before the subsequent titanium coupling process is conducted.

If an aspect ratio of the recess 2a is high (for example, if the recess 2a is a TSV having a high aspect ratio as in the present example embodiment), it may be very difficult or impossible to allow the silane coupling agent to reach a bottom of the recess 2a through the liquid process, or it may take an unacceptably long time from the viewpoint of manufacturing technology. Thus, it may be desirable to implement the silane coupling process by the vacuum deposition process. For this reason, the silane coupling process in this example embodiment is implemented by the vacuum deposition process.

A state where the silane coupling process is completed is depicted in FIG. 1A. A film formed from the silane coupling agent, i.e., the silane-based coupling layer 21a is formed on the entire inner surface of the recess 2a and on the entire surface (top surface) of the substrate 2 at an outside of the recess 2a.

(Titanium Coupling Process)

Now, the titanium coupling process of forming a titanium-based coupling layer 21b (see FIG. 1B) by adsorbing a titanium coupling agent to the surface of the substrate including the inner surface of the recess is performed. Here, the term "titanium-based coupling layer" refers to a film composed of a self-assembled monolayer formed from a titanium coupling agent. This titanium-based coupling layer is provided between the base and the upper layer and enhances the coupling therebetween.

The titanium coupling process may be implemented by a liquid process. As the liquid process, an immersion process of immersing the substrate in a bath filled with a titanium-coupling agent or a spin-on process using a spinner (a spin-type liquid processing apparatus) 40 having a configuration schematically illustrated in FIG. 3B, or the like may be used. In the present example embodiment, the titanium coupling process is performed through the spin-on process.

Figure 3B:
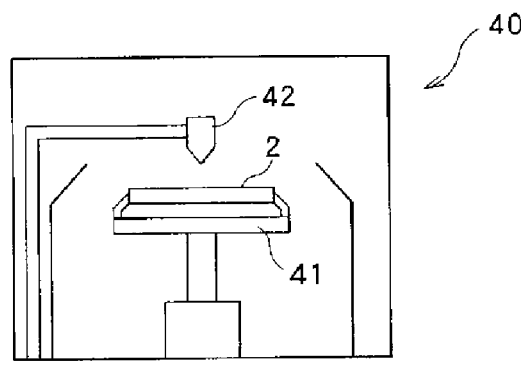

The spin-on process involves rotating the substrate 2 horizontally held on a spin chuck 41 about a vertical axis line and discharging a titanium coupling agent toward a central portion of the substrate 2 from a nozzle 42, as depicted in FIG. 3B. The titanium coupling agent in a liquid state discharged onto the central portion of the surface of the substrate 2 is diffused onto a peripheral portion of the substrate by a centrifugal force, so that a film formed from the titanium coupling agent, i.e., the titanium-based coupling layer 21b is formed on the surface of the substrate. This process may be performed in the air at a room temperature.

Figure 1B:
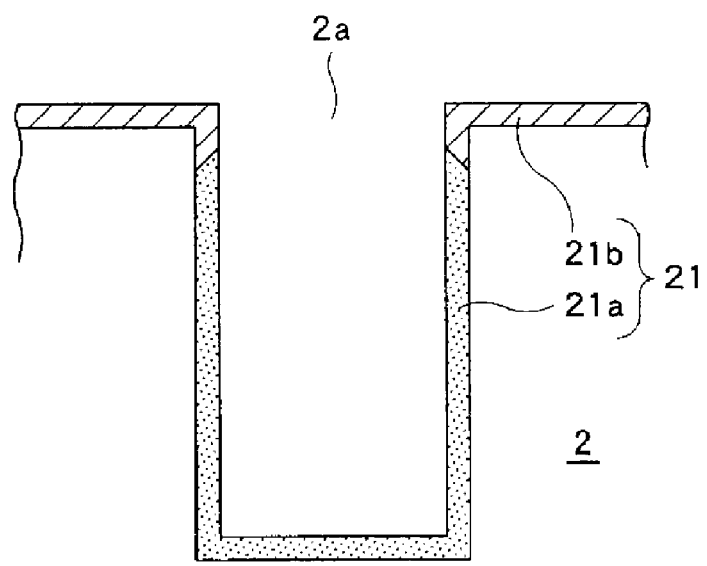

Upon the completion of the titanium coupling process, the silane-based coupling layer 21a and the titanium-based coupling layer 21b are found to be formed on the inner surface of the recess 2a and in the vicinity thereof, as schematically illustrated in FIG. 1B. A portion of the previously formed silane-based coupling layer 21a on which the titanium coupling process is performed is converted to the titanium-based coupling layer 21b. In the present example embodiment, the titanium coupling process is performed for a relatively short time period, so that the titanium coupling agent may not reach the inside of the recess 2a. Accordingly, the silane-based coupling layer 21a is left on the inner surface of the recess 2a.

Adhesivity of the plating is especially an important issue on a region in the vicinity of an opening edge of the recess 2a. A high internal stress is applied to a plating film on this region, and a stress may be easily concentrated on this region when the CMP (Chemical Mechanical Polishing) is performed as a post-treatment. Therefore, especially high adhesivity is required for this region. Meanwhile, the adhesivity as high as required on the region in the vicinity of the opening edge of the recess 2a is not required within the recess 2a. Within the recess 2a, it is important to form a uniform plating layer without a defect. Accordingly, as illustrated in FIG. 1B, by forming the titanium-based coupling layer 21b having a strong coupling force on the region that need to stand the high stress while forming the silane-based coupling layer 21a, which can form a film with high coverage, on the other region, it is possible to satisfy the aforementioned contradictory requirements. Further, since the titanium coupling agent does not reach the inside of the recess 2a, a baking process as a post-treatment can be performed easily.

(Baking Process)

Figure 3C:
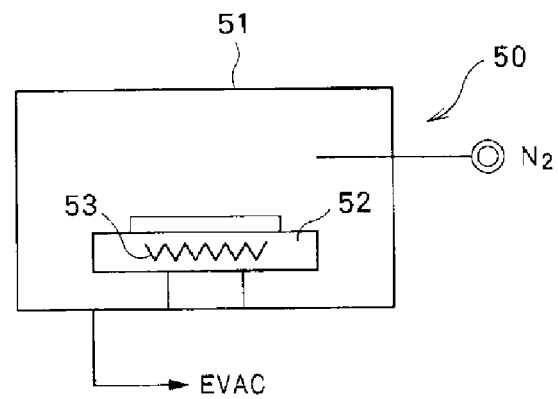

Upon the completion of the titanium coupling process, a baking process for the titanium coupling agent is performed. This baking process may be implemented by heating the substrate under a low oxygen atmosphere, e.g., under a nitrogen gas atmosphere. To elaborate, by using a heating apparatus (bake apparatus) 50 having a configuration schematically illustrated in FIG. 3C, for example, the substrate 2 is mounted on a mounting table 52 provided within a processing chamber 51 under a nitrogen gas atmosphere, and the substrate 2 is heated to, e.g., about 100° C. by a heater 53 embedded in the mounting table 52. Through this baking process, the formation of the titanium-based coupling layer 21b is completed.

Figure 2A:
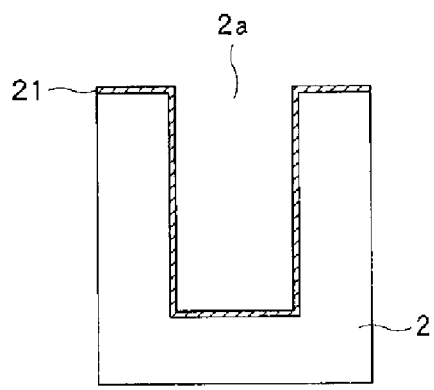
FIG. 2A to FIG. 2F are cross sectional views of the substrate in the vicinity of a recess in order to explain a TSV forming process.

The subsequent processes will be explained with reference to FIG. 2A to FIG. 2F. In FIG. 2A to FIG. 2F, for the simplicity of illustration, the silane-based coupling layer 21a and the titanium-based coupling layer 21b are represented by a single coupling layer 21 without being distinguished from each other. FIG. 2A illustrates a state where the baking process is completed.

(Catalytic Particle-Containing Film Forming Process)

Subsequently, a catalytic particle-containing film forming process is performed. In this process, a Pd nano-colloid solution prepared by dispersing Pd nanoparticles as catalytic metal particles and PVP (Polyvinylpyrrolidone) as a dispersing agent for coating the Pd nanoparticles in a solvent, i.e., a catalytic particle solution is supplied onto the substrate.

Figure 2B:
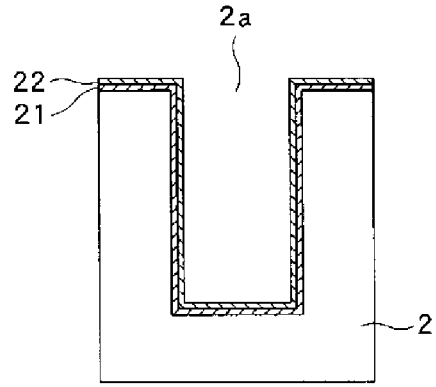

The catalytic particle-containing film forming process may be performed by using the spinner 40 having the configuration schematically illustrated in FIG. 3B, for example. The substrate 2 horizontally held on the spin chuck 41 is rotated about a vertical axis line, and a catalytic particle solution is discharged toward the central portion of the rotating substrate 2 from a nozzle. As a result, as depicted in FIG. 2B, a catalytic particle-containing film 22 containing catalytic metal particles is formed on the coupling layer 21 at the inner surface of the recess 2a and at the surface of the substrate 2 at the outside of the recess 2a.

(First Heating Process)

Upon the completion of the catalytic particle-containing film forming process, a first heating process is performed. The first heating process may be implemented by heating the substrate 2 in a vacuum (decompressed) atmosphere. For example, the first heating process is performed in the heating apparatus 50 having the configuration schematically illustrated in FIG. 3C. To elaborate, the substrate 2 is mounted on the mounting table 52 within the processing chamber 51 under a vacuum (decompressed) atmosphere (only evacuation is performed without supplying a nitrogen gas) and is heated to a temperature of 100° C.

(Second Heating Process)

If the first heating process is finished, a second heating process is performed at a temperature higher than the temperature of the first heating process, ranging from, e.g., 200° C. to 280° C., here, at a temperature of 250° C. The second heating process may be implemented by heating the substrate 2 under a low oxygen atmosphere (desirably, having an oxygen concentration of less than 1%), e.g., under a nitrogen gas atmosphere. For example, the second heating process may be performed in the heating apparatus 50 having the configuration schematically illustrated in FIG. 3C. To elaborate, the substrate 2 is mounted on the mounting table 52 within the processing chamber 51 under a nitrogen gas atmosphere and is heated to a temperature of about 250° C. Upon the completion of the second heating process, the catalytic particle-containing film 22 is found to be strongly coupled to the coupling layer 21.

Through the above-described processes, the pre-treatment for plating is completed.

(Barrier Layer Forming Process)

Figure 2C:
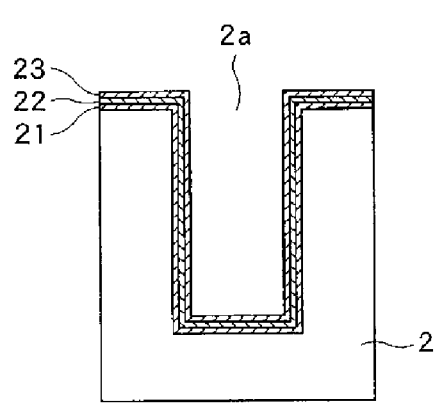

Upon the completion of the second heating process, a Co—W-based barrier layer 23 (containing cobalt and tungsten) is formed by a commonly known electroless plating technology, as depicted in FIG. 2C. At this time, catalytic particles serve as a catalyst for electroless plating.

(Seed Layer Forming Process)

Figure 2D:
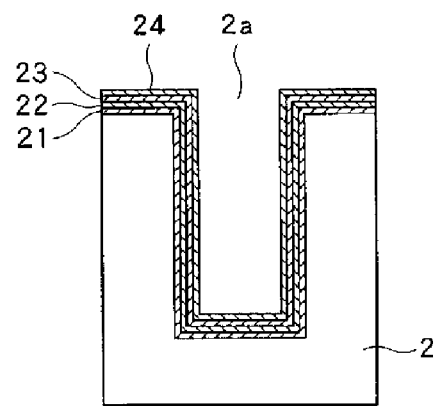

If the barrier layer forming process is completed, a Cu seed layer 24 is formed on the barrier layer 23 by a commonly known electroless plating technology, as depicted in FIG. 2D.

(Burying Process)

Figure 2E:
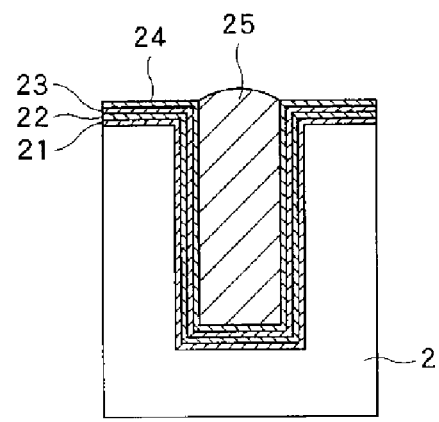
Figure 2F:
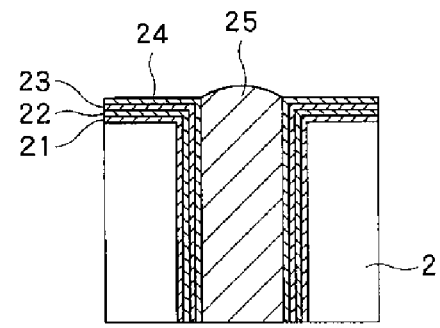

Upon the completion of the seed layer forming process, a Cu plating layer 25 is formed on the Cu seed layer 24 by a commonly known electroless plating technology, as depicted in FIG. 2E. At this time, the recess 2a is completely filled with the Cu plating layer 25.

If the burying process is finished, a rear surface of the substrate 2 is polished by the CMP, so that the Cu plating layer 25 is exposed on the rear surface of the substrate 2. Through the above-described processes, a series of TSV filling processes are completed.

Hereinafter, the two heating processes (the first heating process and the second heating process) performed after the catalytic particle-containing film forming process will be further elaborated in accordance with the example embodiment.

Through experiments, it is found out that the number of catalytic metal nanoparticles (Pd nanoparticles) attached on the surface of the substrate 2 is rapidly increased by heating the substrate first at a relatively low temperature (100° C. in the present example embodiment) and then at a relatively high temperature (250° C. in the present example embodiment) after forming the film of the Pd nano-colloid solution (catalytic particle solution) on the substrate through the catalytic particle-containing film forming process.

In the experiments, after 20,000 Pd nanoparticles per a unit area are attached on the surface of the substrate through the catalytic particle-containing film forming process, the heating process is performed under the following conditions:

Condition 1: Heated at 250° C. without heated at 100° C.
Condition 2: Heated at 100° C. without heated at 250° C.
Condition 3: Heated at 250° C. after heated at 100° C.
Condition 4: No heating process is performed (neither at 100° C. nor at 250° C.)

Here, the heating at the temperature of 100° C. is performed in a vacuum atmosphere, whereas the heating at the temperature of 250° C. is performed in a nitrogen gas atmosphere.

The number of Pd nanoparticles per a unit area after the heating process is found to be 5,000 under the condition 1; 9,000 to 10,000 under the condition 3; and 0 under the condition 4. Although there is no data upon the number of Pd nanoparticles per a unit area under the condition 2, it is understood that the number of the Pd nanoparticles under the condition 2 is equivalent to or smaller than the number of Pd nanoparticles obtained under the condition 1 because density degradation of the barrier layer (Co—W-based film formed by electroless plating) formed later is observed.

Although the analysis on the above experimental results is not completed, the present inventors have expected the experimental results as follows.

By performing the second heating process at the relatively high temperature of about 250° C., the dispersing agent (here, polyvinylpyrrolidone (PVP)) containing organic materials is polymerized, so that a sheet-shaped (film-shaped) polymer is formed. This sheet-shaped polymer covers and seals catalytic metal nanoparticles (here, Pd nanoparticles) therein. Further, the sheet-shaped polymer is strongly coupled to the base coupling layer (layer formed by the coupling process). Accordingly, the catalytic metal nanoparticles are strongly fixed on the base coupling layer by the sheet-shaped polymer, and corrosion resistance against a plating solution of catalytic metal nanoparticles in the subsequent electroless plating process is also improved.

Since the dispersing agent such as PVP tends to absorb moisture easily, a catalytic metal dispersion solution contains water. Thus, a large amount of moisture is contained in the dispersing agent. The moisture contained in the dispersing agent suppresses the polymerization reaction that occurs during the second heating process. Further, the moisture hinders the sound coupling between a linking group of the coupling layer (for example, a NH group at a terminal end) and the catalytic metal nanoparticles.

For this reason, it is deemed that by removing the moisture in the dispersing agent in advance through the first heating process prior to the second heating process at the relatively low temperature, the polymerization reaction that occurs during the second heating process is allowed to proceed smoothly. Further, as an additional advantage achieved by performing the first heating process prior to the second heating process, it is also found that by performing the first heating process at the relatively low temperature, fluidity of the dispersing agent is enhanced and, thus, a resultant film can be uniformed.

The principles of the present disclosure are not limited to those mentioned above. At least, however, it is apparently proved from the aforementioned experimental result that the number of metal nanoparticles adhering to the base layer is increased conspicuously by performing the two heating processes.

In the above-described example embodiment, the catalytic metal particles contained in the catalytic particle solution are palladium (Pd). However, the example embodiment is not limited thereto, and gold (Au), platinum (Pt), ruthenium (Ru), or the like may also be used, for example.

In the present example embodiment, the dispersing agent contained in the catalytic particle solution is polyvinylpyrrolidone (PVP). However, the example embodiment is not limited thereto, and polyacrylic acid (PAA), polyethyleneimine (PEI), tetramethylammonium (TMA), citric acid, or the like may also be used, for example.

In the above-described example embodiment, both the silane coupling process and the titanium coupling process are performed. However, either one of these two process, for example, only the silane coupling process may be performed. In case that the titanium coupling process is not performed, the baking process may be omitted, and the catalytic particle-containing film forming process may be performed directly after performing the silane coupling process by the vacuum deposition. In this case, if the aforementioned two heating processes are performed, the adhesivity of the plating can be greatly improved. Thus, even if only the silane coupling process is performed, it is possible to achieve the adhesivity of the plating without any practical problem. Further, the two heating processes after the catalytic particle-containing film forming process may be advantageous even if the coupling process is performed as the silane coupling process and/or titanium coupling process.

In the above-described example embodiment, the heating process is performed in the low oxygen atmosphere having a low oxygen concentration or in the vacuum atmosphere. However, the heating process may be performed in the atmospheric (air) atmosphere. In such a case, the adhesivity tends to be lower than that in case of performing the heating process in the low oxygen atmosphere having the low oxygen concentration or in the vacuum atmosphere. However, if the reduced level of the adhesivity is acceptable, it is desirable that the heating process is performed in the atmospheric (air) atmosphere to reduce the processing cost.

In the above-described example embodiment, the barrier layer 23 is made of the Co—W-based material. However, the example embodiment may not be limited thereto, and the barrier layer may be formed of a commonly known appropriate barrier material such as, but not limited to, Ni—W-based material (containing nickel and tungsten). Further, the barrier layer may be formed in two layers, as disclosed in Japanese Patent Laid-open Publication No. 2013-194306 filed by the present applicant prior to the filing of the present application.

In the above-described example embodiment, the seed layer 24 and the plating layer 25 are cooper (Cu). However, the seed layer 24 and the plating layer 25 may be, by way of example, but not limitation, tungsten (W), cobalt (Co), nickel (Ni) or an alloy thereof. The barrier layer 23 may be appropriately changed depending on the material of the seed layer 24 and the plating layer 25.

Further, in the above-described example embodiment, the recess 2a serves as a TSV. However, the example embodiment may not be limited thereto, and the recess may serve as a typical via or trench. Further, a target substrate may not be limited to the substrate having the recess.

Figure 4:
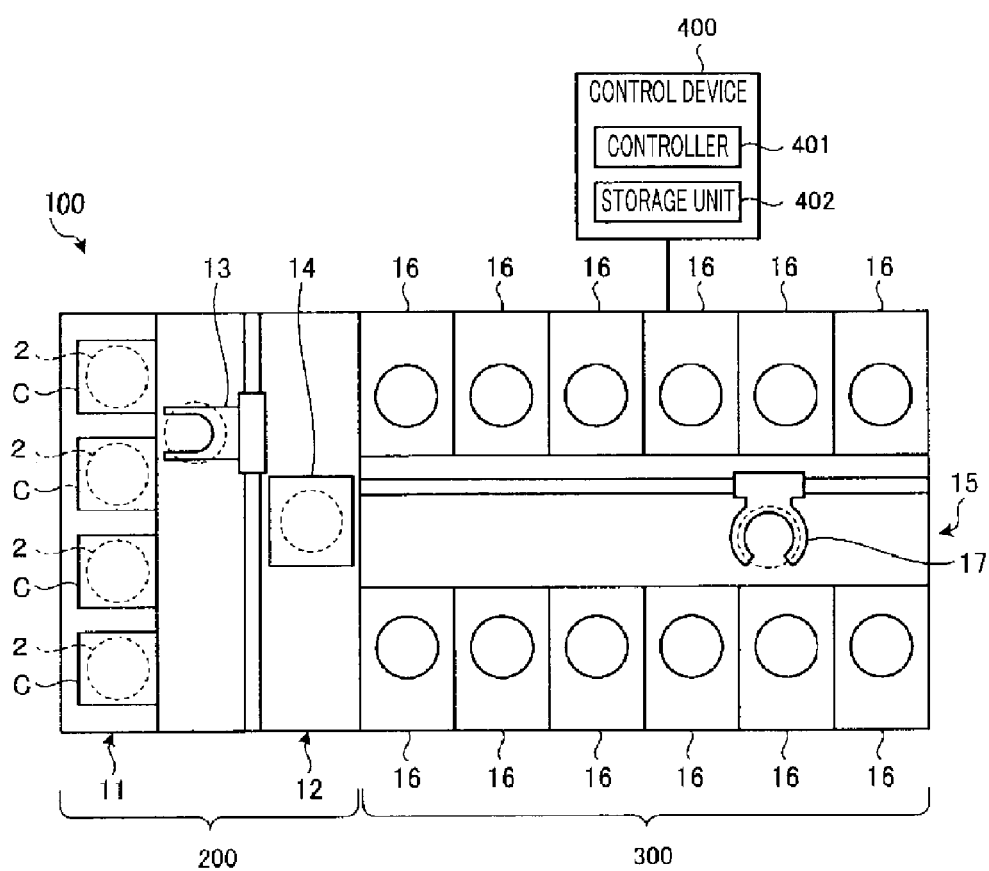
FIG. 4 is a schematic plane view illustrating an example configuration of a plating system of performing a series of processes including the pre-treatment for plating.

The above-described series of processes, i.e., the hydrophilic process, the silane coupling process, the titanium coupling process, the baking process, the catalytic particle-containing film forming process, the first heating process, the second heating process, the barrier layer forming process, the seed layer forming process and the burying process can be performed by, for example, a plating system schematically illustrated in FIG. 4.

In a plating system 100 shown in FIG. 4, a substrate transfer device 13 provided in a loading/unloading station 200 is configured to take out a substrate 2 from a carrier C mounted on a carrier mounting unit 11 to mount the substrate 2 on a transit unit 14. Processing units 16 provided in a processing station 300 are configured to perform at least one of the above-described series of processes. That is, some of the processing units 16 are configured as the apparatuses 30, 40 and 40 illustrated in FIG. 3A to FIG. 3C, respectively. The substrate 2 mounted on the transit unit 14 is taken out of the transit unit 14 by a substrate transfer device 17 of the processing station 300, and then, is loaded into the processing units 16 corresponding to the above-described processes in sequence. In each processing unit 16, a preset process is performed. After the series of processes are completed, the processed substrate 2 is unloaded from the processing unit 16 to be mounted on the transit unit 14. Then, the processed substrate 2 mounted on the transit table 14 is returned back into the carrier C in the carrier mounting unit 11 by the substrate transfer device 13.

The plating system 100 further includes a control device 400. The control device 400 is, for example, a computer and includes a controller 401 and a storage unit 402. The storage unit 402 stores therein programs for controlling various processes performed in the plating system 100. The controller 401 controls the operation of the plating system 100 by reading out a program from the storage unit 401 and executing the program. That is, the control device 400 controls the operations of the individual processing units 16 and the transfer operations for the substrate 2 by the substrate transfer devices 13 and 17 in order to perform the above-described series of processes related to the plating.

The programs may be stored in a computer-readable storage medium and installed on the storage unit 402 of the control device 400 from that storage medium. Here, the computer-readable storage medium may be, by way of example, but not limitation, a hard disk (HD), a flexible disk (FD), compact disk (CD), a magnet optical disk (MO) or a memory card.

We claim:

1. A pre-treatment method for plating, the pre-treatment method comprising:
    a silane coupling process of forming a silane-based coupling layer on an inner surface of a recess included in a substrate;
    a titanium coupling process of forming a titanium-based coupling layer on a region in the vicinity of an opening edge of the recess included in the substrate;
    a catalytic particle-containing film forming process of forming a catalytic particle-containing film on a surface of the substrate by supplying, onto the substrate, a catalytic particle solution which is prepared by dispersing catalytic metal nanoparticles and a dispersing agent in a solvent containing water;
    a first heating process of removing moisture contained at least in the catalytic particle-containing film by heating the substrate to a first temperature; and
    a second heating process of polymerizing the dispersing agent to have a sheet shape by heating the substrate to a second temperature higher than the first temperature after the first heating process and fixing the catalytic metal nanoparticles on the silane-based coupling layer and the titanium-based coupling layer by covering the catalytic metal nanoparticles with the sheet-shaped dispersing agent.

2. The pre-treatment method of claim 1, wherein the second heating process is performed in a low oxygen atmosphere having a low oxygen concentration or in a vacuum atmosphere.

3. The pre-treatment method of claim 1, wherein the first heating process is performed in a low oxygen atmosphere having a low oxygen concentration or in a vacuum atmosphere.

4. The pre-treatment method of claim 1, wherein the catalytic metal nanoparticles are made of at least one material selected from the group consisting of palladium, gold, platinum and ruthenium.

5. The pre-treatment method of claim 1, wherein the dispersing agent is polyvinylpyrrolidone (PVP), polyacrylic acid (PAA), polyethyleneimine (PEI), tetramethylammonium (TMA), or citric acid.

6. The pre-treatment method of claim 1, further comprising:
    a barrier film forming process of forming a barrier layer by electroless plating with the catalytic metal nanoparticles as a catalyst, after the second heating process.

* * * * *